United States Patent [19]

Bozeman, Jr.

[11] Patent Number: 5,296,750

[45] Date of Patent: Mar. 22, 1994

[54] MEASURAND TRANSIENT SIGNAL SUPPRESSOR

[75] Inventor: Richard J. Bozeman, Jr., Dickinson, Tex.

[73] Assignee: The United States of America as represented by the Administrator of the National Aeronautics and Space Administration, Washington, D.C.

[21] Appl. No.: 955,801

[22] Filed: Oct. 2, 1992

[51] Int. Cl.⁵ .................... H01H 35/18; H03K 5/22
[52] U.S. Cl. .................... 307/308; 307/118; 307/234; 307/542.1; 328/1; 340/309.15; 340/507
[58] Field of Search ............ 307/118, 308, 542.1, 307/351, 278, 631, 234; 328/1, 5; 303/3; 137/51; 340/309.5, 309.15, 507, 479, 471; 73/39, 40.5 A

[56] References Cited

U.S. PATENT DOCUMENTS

| | | | |
|---|---|---|---|
| 3,578,007 | 5/1971 | Blake | 137/51 |
| 3,585,512 | 6/1971 | Gassmann | 307/234 |
| 3,689,846 | 9/1972 | Naeyaert | 307/234 |
| 3,790,881 | 2/1974 | Smith | 307/234 |
| 3,961,271 | 6/1976 | Zlydak et al. | 307/234 |
| 4,205,237 | 5/1980 | Miller | 307/118 |
| 4,250,452 | 2/1981 | Gray et al. | 307/118 |
| 4,310,841 | 1/1982 | Olsen | 340/870.43 |
| 4,631,514 | 12/1986 | Fujiwara | 340/52 R |
| 4,704,693 | 11/1987 | Thomas | 364/508 |
| 5,084,696 | 1/1992 | Guscott et al. | 340/541 |
| 5,130,695 | 7/1992 | Scarbrough et al. | 340/309.15 |
| 5,229,753 | 7/1993 | Berg et al. | 340/309.15 |

Primary Examiner—William L. Sikes
Assistant Examiner—Toan Tran
Attorney, Agent, or Firm—Hardie R. Barr; Guy M. Miller; Edward K. Fein

[57] ABSTRACT

A transient signal suppressor (10) for use in a controls system which is adapted to respond to a change in a physical parameter whenever it crosses a predetermined threshold value in a selected direction of increasing or decreasing values with respect to the threshold value and is sustained for a selected discrete time interval. The suppressor (10) includes a sensor transducer (12) for sensing the physical parameter and generating an electrical input signal whenever the sensed physical parameter crosses the threshold level in the selected direction. A manually operated switch (30A, 30B) is provided for adapting the suppressor to produce an output drive signal whenever the physical parameter crosses the threshold value in the selected direction of increasing or decreasing values. A time delay circuit (40,42) is selectively adjustable for suppressing the transducer input signal for a preselected one of a plurality of available discrete suppression time and producing an output signal only if the input signal is sustained for a time greater than the selected suppression time. An electronic gate (25) is coupled to receive the transducer input signal and the timer output signal and produce an output drive signal for energizing a control relay (33) when transducer input is a non-transient signal which is sustained beyond the selected time interval.

8 Claims, 2 Drawing Sheets

MEASURAND TRANSIENT SIGNAL SUPPRESSOR

ORIGIN OF THE INVENTION

The invention described herein was made by an employee of the United States Government and may be manufactured and used by or for the Government of the United States of America for governmental purposes without the payment of any royalties thereon or therefor.

FIELD OF THE INVENTION

The invention relates to transient signal suppressors and more particularly to an electronic system for suppressing transient measurand signals for a selected one of different digitally addressed suppression time periods.

BACKGROUND OF THE INVENTION

In many hydraulic systems such as are used in process control applications and in various test operations, it becomes necessary to sense when a predetermined fluid pressure is reached in the system in order that the system may respond thereto. Typically, a mechanical pressure switch is incorporated in the system to sense when the predetermined pressure is reached and to give an indication signal thereof. In high pressure hydraulic systems, a transient pressure spike may occur as the result of the abrupt closing of a system valve. This phenomenon, commonly known as "water hammer", can momentarily actuate the mechanical pressure switch. Similar transients might result from severe system vibration impulses. Since such transients are not the true static operating pressure of the system, it is oftentimes desirable to suppress actuations of the pressure switch or in the associated indication signals caused by "water hammer" transients or transient vibration impulses.

In the prior art control systems, suppression of transient pressure spikes is usually accomplished by mechanical damping in the pressure switch sensor cavity or in the associated transmission system for the control signal. For example, U.S. Pat. No. 3,578,007 discloses a mechanical surge signal suppression system for use in vehicle transmission systems which employ a centrifugal hydraulic governor. A governor cutoff valve system is used to block transient pressure oscillations during shifting.

U.S. Pat. No. 4,310,841 discloses apparatus for improving the dynamic response of a servo positioning system wherein an electrical input signal which measures pressure or other physical condition is compared to a threshold signal in a manner which delays response and maintains signal level for periods of time without drift. Input level is translated to positioning of a movable vane which is frictionally restricted in movement.

U.S. Pat. No. 4,631,514 discloses a brake control system for preventing jerking reaction by a mechanism which compares actual braking action with a desired braking action to generate a difference signal which, if persistent for a prescribed period, is accepted to operate a secondary brake system.

U.S. Pat. No. 4,703,693 discloses an analog to digital signal processing system for detecting the initial touch of a tool to a workpiece. The delay to a tool touch decision is reduced while avoiding vibration noise spikes by a mechanism with an up/down counter for monitoring signal levels above and below a threshold level and generating a touch alarm when the count exceeds a threshold number.

U.S. Pat. No. 5,084,696 discloses an analog system for dynamically adjusting the threshold of an infra red signal detection comparator in an alarm security system.

In the foregoing prior art systems, it is difficult to adjust with accuracy to a predetermined damping time. Furthermore, the damping times are fixed for a change of the measurand in only one direction, i.e., either an increasing or decreasing measurand.

SUMMARY OF THE INVENTION

The invention is a transient signal suppressor for use in a controls system which is adapted to respond to a change in a physical parameter, such as a sudden increase in pressure whenever it crosses a predetermined threshold value in a selected direction of increasing or decreasing values with respect to the threshold value and is sustained for a selected discrete time interval. The suppressor includes a sensor transducer such as a pressure switch, for sensing the system pressure or other parameter of interest and generating an electrical input signal whenever the sensed physical parameter crosses the threshold level in the selected direction.

A manually operated switch is provided for adapting the suppressor to produce an output drive signal whenever the physical parameter crosses the threshold value in the selected direction of increasing or decreasing values.

A time delay circuit including a resistor-capacitor network is selectively adjustable for suppressing the transducer input signal for a preselected one of a plurality of available discrete suppression times and producing an output signal only if the input signal is a non-transient signal sustained for a time greater than the selected suppression time. An electronic gate is coupled to receive the transducer input signal and the timer output signal and produce a useful output drive signal whenever the transducer input is sustained beyond the selected time interval. The drive signal is coupled to a drive transistor which energizes a controls relay.

DETAILED DESCRIPTION OF THE INVENTION

Figure 1:
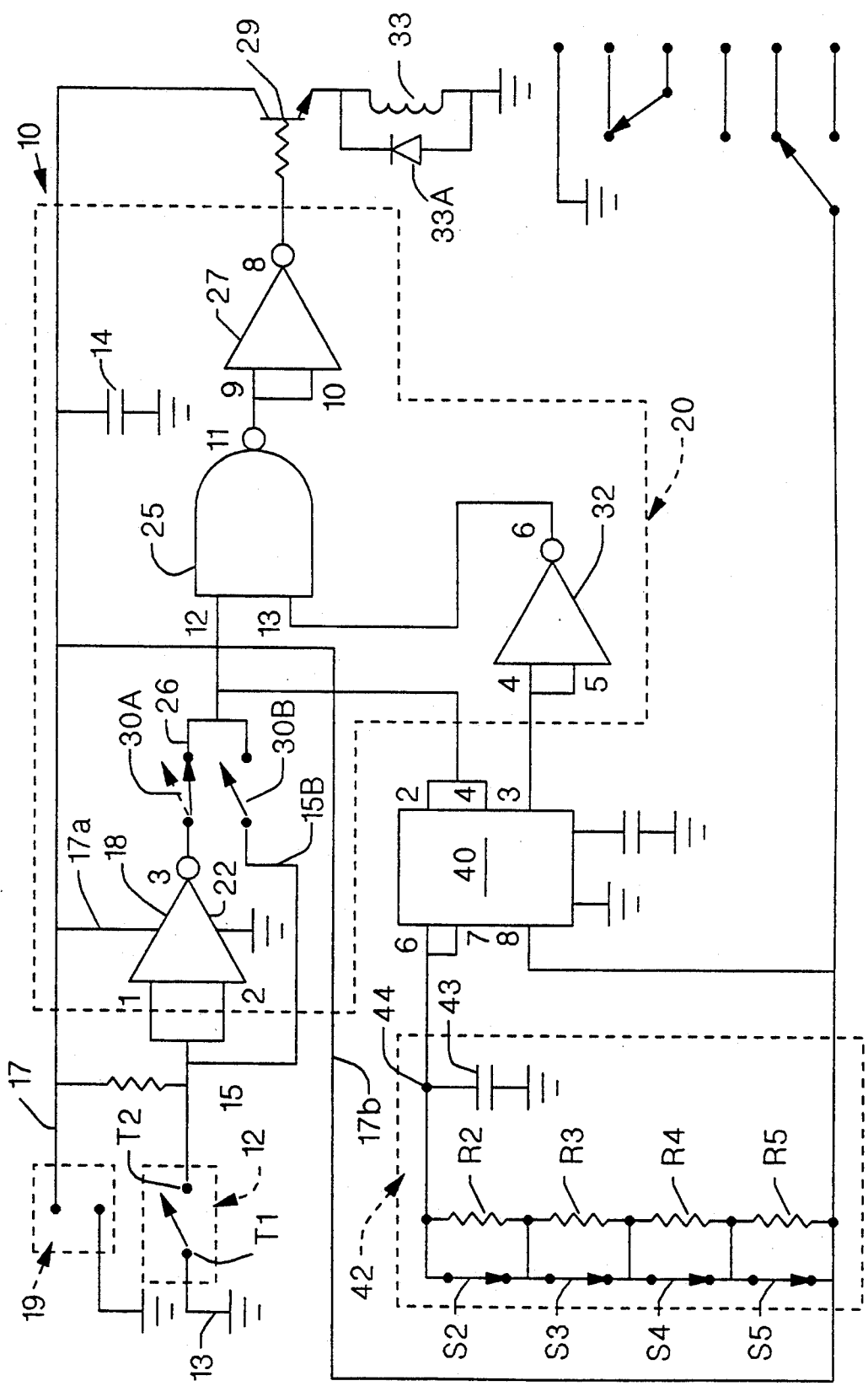
FIG. 1 is an electrical schematic diagram of a measurand transient signal suppressor in accordance with the invention.

Referring more particularly to the drawings, there is shown in FIG. 1, a transient signal suppressor system 10 designed for suppressing transient pressure signals in a hydraulic controls system. The signal suppressor system 10 includes a pressure sensor switch 12 which is mounted in a hydraulic controls system (not shown) for sensing the hydraulic pressure in the controls systems. The pressure switch 12 is an elastic deformation pressure transducer such as of the diaphragm type wherein a contact terminal on the moveable diaphragm is adapted to contact the other contact terminal of the pressure switch at an applied hydraulic pressure which equals or exceeds a predetermined threshold pressure. A pressure bellows or Bourdon tube might also be used in the elastic deformation pressure transducer in lieu of the moveable diaphragm type of transducer.

In a hydraulic controls system wherein a system response is to be effected whenever the hydraulic pressure reaches and exceeds a threshold pressure level, the pressure switch 12 is in the normally open condition and closes when an applied pressure reaches the threshold level. For some hydraulic controls systems, a system response is to be effected whenever the pressure drops below a predetermined threshold level and for such systems, the pressure switch 12 is in a normally closed condition.

In the illustration of the invention shown in FIG. 1, the switch 12 is in the normally open condition with one contact terminal T1 thereof connected to electrical ground by a conductor 13 and the other terminal T2 thereof connected by means of a conductor 15 to the two input terminals of a logic inverter 18 in an integrated circuit 20. Preferably, the integrated circuit 20 is the LM 7400 chip of the National Semiconductor Co. The terminal T2 of the pressure switch 12 and the input terminals of the inverter 18 are also connected to a 5 volt d.c. voltage supply 19 through a pull up resistor 16, which has one resistor terminal connected to the conductor 15 and its other terminal connected to a conductor 17 which is coupled to the positive terminal of the voltage supply 19. Conductor 17 is also provided with an a.c. by-pass to ground by a 0.1 $\mu f$ capacitor 14.

The integrated circuit 20 is supplied power by means of a conductor 17a to the positive terminal of the voltage supply 19. The integrated circuit 20 is connected to electrical ground by a conductor 22.

The output of the logic inverter 18 is adapted to be coupled to a first input terminal 12 of a NAND gate 25 by means of a conductor 26 in which is installed a manually operated selector switch 30A, commonly referred to as a "dip switch." When the pressure switch 12 is in the normally open condition, and the transient signal suppressor system 10 is conditioned to suppress transient signals induced by temporary pressure surges, the selector switch 30A is placed in the closed condition as shown in FIG. 1. It will thus be seen that when the pressure switch 12 is in the open condition, a positive voltage, representing a logic high exists at the inputs to the inverting amplifier 18, while at the same time a logic low exists at the output of the inverter 18 and the input terminal 12 of the NAND gate 25. The output of the NAND gate 25 is sent to an inverter 27, which communicates its output through a resistor 28 to the base of a driver transistor 29 which drives a relay 33 connected between the transistor and ground and adapted for operating or controlling an indicator or other device which provides a desired output for the hydraulic controls systems. The relay is shown with a suppressor diode 33A, connected cathode to ground in parallel therewith and may operate a plurality of contacts to control several devices.

The second input terminal 13 of the NAND gate 25 is coupled to the output 6 of a second inverter 32 in the integrated circuit chip 20. The input terminals 4, 5 of the inverter 32 are coupled to one another and also to the output terminal 3 of a solid-state timer 40 provided by an integrated circuit chip LM555 of the National Semiconductor Company.

Terminals 2 and 4 of timer 40 are coupled to one another and to the output of inverter 18 by a conductor 31, conductor 26 and switch 30A. Terminal 8 of timer 40 is coupled to the positive terminal of the d.c. voltage supply 19 by a conductor 17b which connects with conductor 17. A terminal 1 of the timer 40 is connected to electrical ground and a terminal 9 of the timer 40 is connected to electrical ground through a capacitor 41, with capacitance of 0.05 $\mu f$. Other terminals 6, 7 of the timer 40 are coupled to a resistor-capacitor (RC) network 42 which comprises a plurality of serially connected resistors R2, R3, R4 and R5, a capacitor 43 of 10 $\mu f$ capacitance which is coupled to the output terminal 44 and to electrical ground, and a plurality of serially connected manually operated switches S2, S3, S4 and S5. The resistor R2 and one contact terminal of the switch S2 are directly coupled to the terminals 6, 7 of timer 40 and one contact terminal of the switch S5 and the resistor R5 are directly coupled to the conductor 17b.

Accordingly, when all switches S2, S3, S4, S5 are closed, the terminals 6, 7 of the timer 40 are directly coupled to the d.c. voltage supply 19 and the total resistance of the resistor-capacitor network 42 is substantially zero. However, each of the switches S1 through S5 is paired with an associated resistor such that one contact terminal of the switch S5 is coupled to one terminal of the resistor R5 and the second contact terminal of the switch S5 is coupled to the other terminal of the resistor R5. Similar connections are made between switch S4 and resistor R4, between switch S3 and resistor R3, and between switch S2 and resistor R2. If any one of the series-connected switches is opened, its associated resistor becomes an active component of the resistor-capacitor network. For example, it will be seen that when switch S2 is open and switches S3, S4 and S5 are closed, only the resistor R2 and capacitor C1 make up the active resistor-capacitor network 42 which effects the operation of the timer 40 when the pressure switch 12 is closed by a rise of hydraulic pressure above the critical threshold level. For purposes of effecting a discrete time delay and providing for a selection from a plurality of such time delays in responding to the closure of pressure switch 12, as will hereinafter be described, the resistance values in network 42 are selected such that R2=800K ohms, R3=400K ohms, R4=200K ohms, and R5=100K ohms.

The initial conditions are a logic high at the input of inverter 18 and a logic low at the output of inverter 18 which also exists at terminals 12 and 4 of timer 40, input terminal 12 of NAND gate 25 and the inputs of inverter 32. Accordingly, when pressure switch 12 closes, the input to the inverter 18 is changed to a logic low and its output to a logic high which is also transmitted to terminal 12 of NAND gate 25 and terminals 2, 4 of timer 40. When a logic high is imposed on terminals 2, 4 of timer 40, the RC network 42 increases the voltage at terminals 6, 7 of timer 40 to a level at which the logic low at its terminal 3 is changed to a logic high for the time period determined by the resistance and capacitance values in network 42.

Accordingly, the initial condition of a logic low at the inputs of inverter 32 is also changed to a logic high during the time period controlled by the RC network 42 and the initial condition of a logic high at the output of inverter 32 is changed to a logic low for the duration of this period.

The initial conditions of a logic low at input terminal 2 and a logic high at input terminal 13 of NAND gate 25 are reversed during the time period set by the network 42 and therefore the logic high at the output of NAND gate 25 stays unchanged. However, at the end of the time period, a logic low is produced at terminal 3 of timer 40 and at the input to inverter 32 whereby the output of inverter 32 and its input to NAND gate 25 change to the logic high condition. Since both inputs to NAND gate 25 are then at logic high, its output is a logic low and the output of inverter 27 is a high which drives the transistor 29 and energizes the relay 33.

It will therefore be seen that a time delay or suppression time is imposed upon the transmission of the electrical signal which indicates the closure of the pressure switch 12 in response to a pressure surge. If the pressure switch 12 is still closed at the end of the time delay, the pressure surge is not a transient but a sustained pressure above the critical threshold level and an electrical signal will then be transmitted from NAND gate 25 to drive the transistor 29 and energize the responsive control relay. However, if the pressure switch 12 should open during the time delay, the outputs of inverter 18, NAND gate 25 and inverter 27 return to their initial conditions and no driving signal is transmitted to the drive transistor 29. The suppressor 10 therefore determines whether the measurand signal is a transient or whether it is actually a sustained change in system operating pressure and gives an output to the process control system only if the predetermined threshold pressure is sustained for a preselected suppression time.

It is also to be noted that the suppression time can be selected by selective operation of the switches S2 through S5 for changing the resistance in the resistor-capacitor network 42. Suppression times in seconds can be selected in accordance with the following table which shows the conditions of the switches S2 through S5 for providing a discrete suppression time. In the table, "C" indicates a closed condition for a switch and "O" indicates that the switch is open.

| | SUPPRESSION TIMES | | | |
|---|---|---|---|---|
| Time (Secs.) | S2 | S3 | S4 | S5 |
| 1 | C | C | C | O |
| 2 | C | C | O | C |
| 3 | C | C | O | O |
| 4 | C | O | C | C |
| 5 | C | O | C | O |
| 6 | C | O | O | C |
| 7 | C | O | O | O |
| 8 | O | C | C | C |

Heretofore, the suppressor 10 has been described for use in a controls system where it is desired to respond to a pressure surge which is above a critical threshold pressure and to suppress signals representative of transient pressure spikes. The suppressor 10 may also be conditioned for use in a controls system where it is desired to respond to a drop in pressure below a critical pressure level and to suppress signals representative of transient pressure drops below the critical level. For this kind of operation, the pressure switch 12 is normally closed and use is made of a selector switch 30B which is installed in conductor 15B for selectively coupling the terminal T2 of pressure switch 12 to the input 12 of NAND gate 25. With the initial condition of a closed pressure switch 12, the selector switch 30A is moved to open condition and selector switch 30B is closed. A logic low condition therefore exists at input terminal 12 of NAND gate 25 and a logic high at its input terminal 3. Terminals 2, 3 and 4 of timer 40 are at logic low. A logic high at the output of NAND gate 25 inverted to a logic low at the output of inverter 27 places transistor 29 in "OFF" condition.

When the pressure switch 12 opens in response to a pressure drop below the predetermined critical level, terminal 12 of NAND gate 25 changes to logic high condition. The terminals 2, 3 and 4 of timer 40 also change to logic high. After a suppression time determined by the resistor-capacitor network 42, terminal 3 of timer 40 goes to logic low, and the output of inverter 32 and the input terminal 13 of NAND gate 25 go to logic high. In response, the output of NAND gate 25 changes to logic low which imposes a logic high through inverter 27 at the base of transistor 29 and drives the transistor to energize the relay 33. The suppressor 10 therefore suppresses a pressure switch open signal for the selected suppression time so that the system responds only to a sustained pressure drop.

While operation of the suppressor 10 has been illustrated for a system where pressure is the critical parameter, the invention can be used with any type of end trip point sensor that is sensitive to an undesired transient actuation. Accordingly, the suppressor 10 could be used with such sensors as load switches, flow switches, vibration switches, liquid level switches, proximity switches, and temperature switches.

Figure 2:
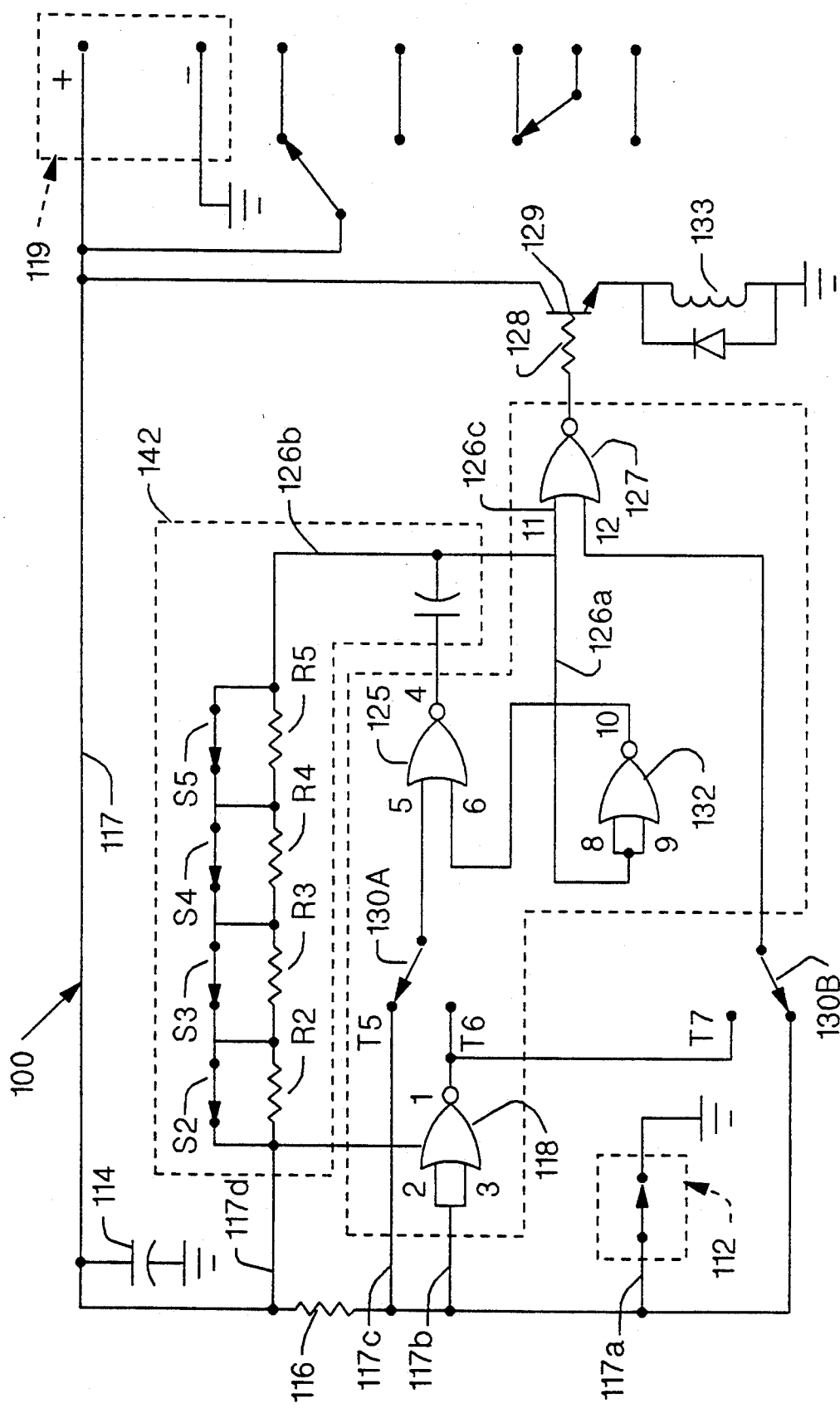
FIG. 2 is an electrical schematic diagram of a modified form of the invention.

A modified form of the invention, illustrated by the suppressor 100 shown in FIG. 2, uses an integrated circuit provided by the DM7402 chip of the National Semiconductor Co. and which is comprised entirely of NOR gates. The suppressor 100 is powered by a 5 volt d.c. voltage supply 119 and is adapted to respond to a pressure switch 112 incorporated therein. One terminal of switch 112 is connected to electrical ground and the other to the voltage supply 119 through a conductor 117a, resistor 116 and conductor 117. The conductor 117a is also coupled by a conductor 117b to the inputs of a NOR gate 118 in a DM 7402 integrated circuit and by a conductor 117c to the contact terminal T5 of a selector switch 130A, which when closed couples the conductor 117a to a first input terminal 5 of a second NOR gate 125. The output of NOR gate 118 is coupled to the other contact terminal T6 of selector switch 130A and also to the terminal T7 of a second selector switch 130B. A capacitor 114 provides conductor 117 with an a.c. bypass to ground.

A second input terminal 6 of NOR gate 125 is coupled to the output of a third NOR gate 132 having two input terminals which are coupled together and also to one end of a resistor-capacitor network 142 by a conductor 126a and branch conductor 126b. The RC network 142 is identical to the RC network 42 in the first embodiment of the invention shown in FIG. 1. It is comprised of resistors R2, R3, R4 and R5, series-connected switches S2, S3, S4 and S5 and a 10 μf capacitor 141. The 5 volt d.c. voltage supply is connected to the other end of the network 142 by conductor 117 and a branch 117d which connects to the resistor R2 and a terminal of the switch S2.

The output of NOR gate 125 is coupled to one side of the capacitor 141 whose other side is coupled to a first input terminal 11 of a fourth NOR gate 127 by the conductor 126b and a branch conductor 126c. Conductor 117a with a selector switch 130B installed therein is connected to a second input 12 of NOR gate 127. The output of NOR gate 127 is coupled through a resistor 128 to the base of a drive transistor 129 which is adapted to energize a relay 133.

When the suppressor 110 is used with a hydraulic system wherein an indication or controlled response is desired when a predetermined pressure is reached, the pressure switch 112 is in normally open condition. The selector switch 130A is positioned to directly couple conductor 117a to the input 12 of NOR gate 118 and at the same time selector switch 130B is positioned to couple conductor 117a to the second input 12 of NOR gate 127.

With pressure switch 112 open, the initial conditions are a logic high at both inputs of NOR gate 118, a logic low at the output of gate 118 and input 5 of NOR gate 125. Both inputs of NOR gate 132 are at logic high so that its output is at logic low which is coupled to the input 6 of NOR gate 125. With both its inputs at logic low, the output of gate 125 is at logic high which is converted to a logic low at the input 11 of NOR gate 127 by the capacitor 127. The transistor 129 is "OFF".

When a pressure surge closes pressure switch 112, the input 5 of NOR gate 125 goes low and its output goes high. The input 12 of NOR gate 127 goes low.

During a prescribed time delay determined by the resistor-capacitor network 142, the logic high at input 11 of NOR gate 127 gradually changes to logic low, after which time both inputs to NOR gate 127 are at logic low and its output switches to logic high which turns on the transistor 129 and energizes the relay 133. If the pressure switch 112 should open during the suppression time, a reversion to the initial logic conditions takes place to prevent transmission of a drive signal to the transistor 129.

For an application of the suppressor 110 to a system where it is desired to provide an indication or process control when the pressure drops below a critical level, pressure switch 112 is normally closed, the manual selector switch 130A is moved to contact T6 and selector switch 130B is moved to contact T7. The initial conditions then are a logic low at the inputs of NOR gate 118 and a logic high at its output and the input 5 of NOR gate 125. The input of NOR gate 132 is at logic high and its output at logic low which is coupled to input 6 of NOR gate 125. Input 12 of NOR gate 127 is at logic high and its input 11 is also at logic high which produces a logic low at the output of gate 127.

When pressure switch 112 opens in response to a drop in system pressure below the critical threshold value, a logic low is provided at input 12 of NOR gate 127 and its output goes high to drive the transistor 129.

It is to be appreciated that the size of the capacitor in the resistor-capacitor network and the several resistors incorporated therein may have different values than those described herein whereby a different range, number and unit size of RC time constants can be made available. In addition, the drive transistor output can be used to drive an actuator other than a controls relay.

It is also to be understood that the foregoing description of the invention has been presented for purposes of illustration and explanation and is not intended to limit the invention to the precise form disclosed. It is to be appreciated therefore that various component and structural changes may be made by those skilled in the art without departing from the spirit of the invention.

I claim:

1. A transient signal suppressor for use in a controls system which is adapted to respond to a change in a physical parameter whenever it crosses a predetermined threshold value in a selected direction of increasing or decreasing values with respect to the threshold value and is sustained for a selected discrete timer interval, said suppressor including:
    a sensor transducer for sensing the physical parameter and generating an electrical input signal whenever the sensed physical parameter crosses the threshold level in the selected direction of increasing or decreasing values;
    an adjustable time delay circuit for suppressing the input signal for a preselected one of a plurality of available discrete suppression times and producing an output signal only if the input signal is sustained for a time greater than the selected suppression time;
    an electronic gate coupled to receive the transducer electrical input signal and the time delay circuit output signal and to produce a useful output drive signal whenever the transducer electrical input signal is sustained beyond the selected suppression time; and
    a manually operated switch coupled between the transducer and said gate for adapting the suppressor to produce an output drive signal whenever the physical parameter crosses the threshold value in the selected direction of increasing or decreasing values.

2. A transient signal suppressor as set forth in claim 1 wherein said sensor transducer comprises a switch which is normally open and closes in response to a rise in the sensed physical parameter above said threshold value.

3. A transient signal suppressor as set forth in claim 1 wherein said sensor transducer comprises a switch is normally closed and opens in response to a drop in the sensed physical parameter below said threshold value.

4. A transient signal suppressor as set forth in claim 1 wherein said sensor transducer comprises a pressure switch in the form of an elastic deformation pressure transducer.

5. A transient signal suppressor as set forth in claim 1 wherein the adjustable time delay circuit includes a resistor-capacitor network with a plurality of resistance values and switching means which are operable to selectively exclude any of said resistance values to adjust the time interval for which a transducer signal is suppressed.

6. A transient signal suppressor as set forth in claim 5 wherein said electronic gate is a NAND gate.

7. A transient signal suppressor as set forth in claim 5 wherein said electronic gate is a NOR gate.

8. A transient signal suppressor system as set forth in claim 1 which further includes a drive transistor coupled at its base to receive the output of the electronic gate and with its transistor output terminal coupled to a controls relay whereby the relay is adapted to be energized by the drive transistor.

* * * * *